United States Patent [19]

Dudoff et al.

[11] Patent Number: 5,454,885
[45] Date of Patent: Oct. 3, 1995

[54] METHOD OF PURIFYING SUBSTRATE FROM UNWANTED HEAVY METALS

[75] Inventors: Gregory K. Dudoff, Phoenix; Karl A. Harris, Liverpool; Lee M. Mohnkern, Liverpool; Richard J. Williams, Liverpool; Robert W. Yanka, Liverpool, all of N.Y.; Thomas H. Meyers, III, Westover, W. Va.

[73] Assignee: Martin Marietta Corporation, Syracuse, N.Y.

[21] Appl. No.: 170,708

[22] Filed: Dec. 21, 1993

[51] Int. Cl.$^6$ .................. H01L 21/00; H01L 21/324
[52] U.S. Cl. .................. 148/562; 148/DIG. 63; 148/DIG. 64; 437/12; 437/939
[58] Field of Search ............. 437/12, 939; 148/DIG. 63, 148/DIG. 64, 562

[56] References Cited

U.S. PATENT DOCUMENTS

| | | | |
|---|---|---|---|
| 3,929,529 | 12/1975 | Poponiak | 437/12 |
| 4,193,003 | 3/1980 | Blanchard et al. | 437/156 |
| 4,416,051 | 11/1983 | Thomas et al. | 437/12 |
| 4,504,334 | 3/1985 | Schaake et al. | 437/12 |
| 4,507,160 | 3/1985 | Beck et al. | 437/12 |
| 4,561,171 | 12/1985 | Schlosser | 437/12 |
| 4,575,466 | 3/1986 | Iwai et al. | 437/156 |
| 4,960,728 | 10/1990 | Schaake et al. | 148/DIG. 64 |
| 5,130,260 | 7/1992 | Suga et al. | 437/10 |

OTHER PUBLICATIONS

T. H. Meyers et al, "Dopant diffusion in HgCdTe grown by photon assisted molecular–beam epitaxy", Jul./Aug. 1992, *Journal of Vacuum Science Technol.* B10 (4), pp. 1438–1443.

R. Korenstein et al, "Copper Outdiffusion from CdZnTe Substrates and its Effect on the Properties of MOCVD–Grown HgCdTe", *Extended Abstracts*, Oct. 19–21, 1993, pp. 53–54.

J. P. Tower et al, "CdZnTe Substrate Impurities and Their Effects on LPE HgCdTe", *Extended Abstracts*, Oct. 19–21, 1993, pp. 47–50.

K. A. Harris et al, "Growth of HgCdTe and other Hg–based films and multilayers by molecular beam epitaxy", J. Vac. Sci. Technol.A.4, No. 4, pp. 2061–2065.

T. H. Meyers et al, "Properties of HgCdTe films and Hg–based quantum well structures grown by photoassisted molecular–beam epitaxy", Mar./Apr. 1989, J. Vac. Sci. Technol. A.7(2), pp. 300–304.

*Primary Examiner*—Upendra Roy
*Attorney, Agent, or Firm*—Paul Checkovich; Stephen A. Young

[57] ABSTRACT

A typical source of cadmium and tellurium is as a by-product of copper mining. Although attempts are made to remove impurities such as copper prior to commercially supplying them for forming material like cadmium telluride, cadmium zinc telluride and cadmium telluride selenide for use as a substrate to support electronic circuitry, processing during formation of the circuitry causes the impurities from the substrate to segregate into the circuitry, resulting in unacceptable electrical performance of the circuitry. A method for purifying the substrate prior to circuitry formation includes forming a sacrificial layer of mercury telluride or mercury cadmium telluride on the substrate, annealing the combination at elevated temperature with an overpressure of mercury and removing the sacrificial layer along with a contiguous portion of the substrate, if desired. The sacrificial layer may be formed by vapor phase type processes or even by liquid phase epitaxy.

10 Claims, 1 Drawing Sheet

5,454,885

METHOD OF PURIFYING SUBSTRATE FROM UNWANTED HEAVY METALS

BACKGROUND OF THE INVENTION

The present invention relates to purified substrates and to a method for making same and, more particularly, to substrates such as cadmium telluride, cadmium zinc telluride and cadmium telluride selenide formed from II–VI elements and to the purification thereof.

A current source of cadmium (Cd) and tellurium (Te) is as a by-product of copper mining. Attempt is made by entities in the commercial supply chain to refine the cadmium and tellurium and to remove impurities, such as copper, therefrom before the Cd and/or Te is, for example, provided for use in electronic devices. However, applicants have determined that even the supposedly best and highest quality of commercially available cadmium and tellurium, and compounds like cadmium telluride (CdTe) and cadmium zinc telluride (CdZnTe), still often have unacceptable levels of impurities, and especially copper, for use of such materials in certain electronic devices and applications, such as for sensitive infrared detectors. Cadmium telluride selenide (CdTeSe) is also expected to contain similar impurities. Impurities contribute to a degradation of electrical performance as well as to a reduction of expected operational lifetime of the electronic devices.

Typically bulk II–VI materials like CdTe, CdZnTe or CdTeSe will be grown by a well-known horizontal Bridgeman technique or by other well known standard crystal growing processes. Generally this technique and these processes use a seed crystal disposed in a container, such as quartz-ware, which container offers another potential source of contamination by impurities leaching therefrom into the growth.

When such II–VI materials are to be used as a substrate upon which delicate electronic circuits will be formed, it is believed that processing during formation of the electronic circuits causes impurities to flow from the substrate into the desired electronic circuitry, thereby degrading electrical characteristics and performance of the resulting circuits.

An article entitled "Dopant diffusion in HgCdTe grown by photon assisted molecular-beam epitaxy"—T.H. Myers et al, *Journal of Vacuum Science Technology*, B10(4), July/August 1992, pgs. 1438–1443, discusses copper as an impurity in layers grown on certain CdTe and CdZnTe substrates. An article entitled "Copper Outdiffusion from CdZnTe Substrates and its Effect on the Properties of MOCVD-Grown HgCdTe"—R. Korenstein et al, *Extended Abstracts*, 1993 Workshop on the Physics and Chemistry of Mercury Cadmium Telluride and other IR Materials, Oct. 19–21, 1993, pages 53–54, references the above-noted Myers et al article and its discussion of copper diffusion during MBE (sic— PAMBE) growth and/or post growth annealing of epitaxial layers. Neither of these references is deemed to teach or suggest how to purify the underlying substrate for use in creating dependable and reliable electronic circuitry.

Accordingly, it would be desirable to obtain a high quality, substantially impurity-free II–VI bulk material suitable for use in making delicate and sensitive electronic circuitry. It is also desired to have available a process for removing impurities from II–VI commercially available bulk material so that the purified bulk material can be used in conjunction with such circuitry. By "substantially impurity-free" is meant that the level of impurities in the material are below a pre-determined threshold at which concentration operation of the electronic circuitry is not materially adversely affected.

SUMMARY OF THE INVENTION

In accordance with the present invention, a method for purifying a first material including at least an impurity and a first surface, and suitable for forming a substrate to receive a subsequent layer of semi-conductor material for forming electronic circuitry comprises forming a layer of a second material on at least a portion of the first surface of the first material, heating the combination of the first and second material to a temperature adequate to cause migration of at least some of the impurity from the first material into the second material and removing the second material along with the migrated impurity to expose a second surface of the first material suitable for receiving the subsequent layer of semiconductor material. The steps of forming, heating and removing may be repeated a sufficient number of times until a predetermined purity of the first material as determined in response to the level of impurity remaining in the first material is obtained. Impurities may include copper, silver, gold, potassium, sodium and combinations thereof. Removal may include polishing the layer to effect its removal or cutting between the layer and the first material.

The first material may include an item selected from the group consisting of cadmium telluride, cadmium zinc telluride and the layer may include an item selected from the group consisting of mercury telluride and mercury cadmium telluride. The cadmium and/or tellurium constituents may be obtained as a by-product of copper mining. When the layer includes a mercury constituent, heating of the layer is performed in an environment having an overpressure of mercury for preventing mercury form leaving the layer during heating.

The layer may be formed by a semiconductor material growth process. Such processes include photon assisted molecular beam epitaxy, molecular beam epitaxy, liquid phase epitaxy, metal organic chemical vapor deposition and iso thermal vapor phase epitaxy.

After purification, the material comprising cadmium telluride, cadmium zinc telluride or cadmium telluride selenide may have a concentration of copper of less than about $10^{15}$ copper ions per cubic centimeter.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

BRIEF DESCRIPTION OF THE DRAWING

Referring to FIG. 1, a side elevational view of a three-dimensional substrate comprising a bulk II–VI material, such as cadmium telluride, cadmium zinc telluride or cadmium telluride selenium, is shown. The contour and outer dimensions of substrate 10 are not deemed to be critical. In fact, substrate 10 may be oversized from its ultimate desired size while being processed in accordance with the present invention and then be brought to the desired shape and dimensions such as by laser ablation, mechanical cutting or scribing, as is known in the art.

Figure 1:
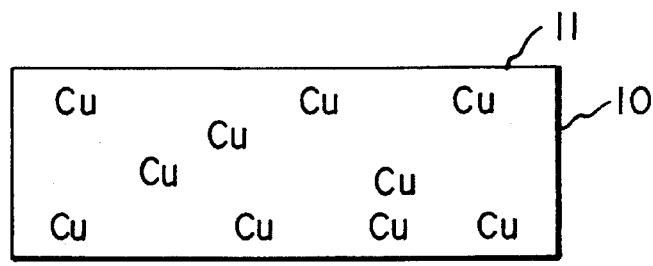
FIGS. 1–5 show representative stages of a process for removing impurities from a bulk material in accordance with the present invention.

With respect to the term "II–VI material", the designation "II" refers to column IIb of the Periodic Table of the Elements which includes the elements zinc, cadmium and mercury (Hg), while that of "VI" refers to column VIa of the Periodic Table and includes tellurium and selenium. Impurities are collectively represented in the figures of the drawing by the symbol Cu which, although properly the chemical symbol for copper, is not to be taken as limited to copper but may include other impurities as well, especially those subject to removal from substrate 10 in accordance with the present invention and as described in more detail below.

The material for substrate 10 may be obtained commercially, such as from II–VI, Inc., Saxonburg, Pa. for CdTe, CdZnTe and CdTeSe, where it is generally prepared by horizontal Bridgeman or other well known standard crystal growing techniques. Inasmuch as the starting materials cadmium and tellurium are often, if not predominantly, acquired as by-products of copper mining operations, it is not unreasonable to expect that at least some copper will remain in the cadmium and tellurium fractions and thus in the resulting CdTe, CdZnTe and CdTeSe regardless of attempts to remove it prior to commercial distribution. Suppliers or their sources of CdTe, CdZnTe or CdTeSe II–VI bulk material attempt to remove excess copper impurities from the II–VI bulk material so that it may be used in electronic devices.

However, applicants have determined that regardless of any such removal attempts, the level of impurities including copper remaining in commercially available II–VI bulk material that applicants have obtained is still too high for use in conjunction with forming certain electronic circuitry. These relatively high concentrations of impurities degrade electrical characteristics and performance of electronic circuitry to be formed on the II–VI material due to transfer of the impurities into the circuitry during conventional circuitry formation, such as epitaxial growth with appropriate masking and partial removal. The circuitry generated from epilayers to be formed on the II–VI material containing unacceptably high concentration of impurities cannot be effectively and efficiently used in certain electronic applications, such as infrared detection, when compared to what quality of epilayer for such circuitry would be expected if a more pure form of a II–VI material having a lower concentration of such impurities were available for the substrate.

In preparation for employment of an impurity extraction process or substrate refinement process in accordance with the present invention, a surface of substrate 10 as represented by surface 11 is polished so that it is fairly smooth and preferably substantially planar in order to minimize surface defects and to eliminate pits and bumps to the extent practicable. That is, surface 11 is prepared to be smooth enough for receiving a to-be-applied sacrificial layer 12 (FIG. 2) and for enabling establishment of a bond between substrate 10 and layer 12. The preparation and processing of surface 11 for receiving layer 12 may be accomplished by any method which permits application of layer 12 to surface 11. Examples of techniques for applying layer 12 to surface 11 that are considered to be suitable for use with the present invention include semiconductor material growth processes, such as molecular beam epitaxy (MBE), photoassisted molecular beam epitaxy (PAMBE), liquid phase epitaxy (LPE), metal organic chemical vapor deposition (MOCVD) and isothermal vapor phase epitaxy (ISOVPE) for forming layer 12.

Figure 2:
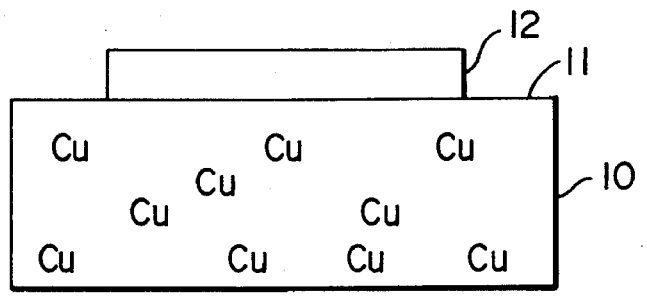

Referring to FIG. 2, substrate 10 is shown having sacrificial layer 12 disposed over a portion of surface 11 in accordance with the present invention.

When substrate 10 includes cadmium telluride, cadmium zinc telluride or cadmium telluride selenide then layer 12 may include mercury telluride or mercury cadmium telluride (conventionally referred to as "MCT"). The actual composition of layer 12 is preferably selected to maximize the impurity segregation effect of layer 12 with respect to the composition of substrate 10.

One way for recognizing the segregation effect of one material over that of another material is to consider the relative magnitude of the segregation coefficient for the respective materials. The values of segregation coefficients for II–VI materials are readily available from reference works on crystal growth, such as published articles and/or textbooks.

In general, if two dissimilar materials abut along a surface and there is a mobile entity, like impurities in II–VI materials under discussion, at equilibrium, then the segregation coefficient will suggest in which of the dissimilar materials the mobile entity is more likely to be, or prefers to be, found. The relative magnitude of the respective coefficients is indicative of the degree to which the segregation preference is expected to be effected. For example, if a first material has a segregation coefficient of 100 while a second and third material have respective segregation coefficients of 10 and 1000, it is to be expected that for the combination the first and second material the mobile entity will be more likely found in the first material, while for a combination of the first and third material the expectation would be for the mobile entity to be more likely found in the third material. In general, the larger the segregation coefficient for a specific material with respect to other materials, the greater the implication that the mobile entity prefers to be in that specific material.

As an example, in one embodiment of the present invention, the composition of layer 12 may be represented by $Hg_{1-x}Cd_xTe$, wherein $x \leq 0.5$ and preferably $x \leq 0.2$. When layer 10 includes CdTe, CdZnTe or CdTeSe, then as the value of x within the range expressed in the preceding sentence decreases (thereby indicating an increase in the amount of mercury (Hg) in the overall material $Hg_{1-x}Cd_xTe$) then it is expected that more copper and other mobile impurities will segregate or move into layer 12. Obtaining a desired value for x during formation of layer 12 is well known within the art.

In a currently preferred embodiment of the present invention, epitaxial layer 12 may be formed or grown as a single crystal by molecular beam epitaxy (MBE) or by currently more preferred photon assisted molecular beam epitaxy (PAMBE) in which surface 11 and layer 12 are exposed to a source of photons, such as a laser, during growth of layer 12. It has been found that a thickness of about 10 microns minimum and preferably about 10–20 microns is adequate for layer 12 when material 10 is about 0.8 to 1.1 mm thick, as measured from surface 11 to the lower surface shown. In other words, the ratio of the thickness of substrate 10 to that of layer 12 may be in the range of about 55:1 to about 400:1.

The area of the surface of layer 12 that is contiguous with surface 11, may extend over entire surface 11, or as shown, may cover only a portion of surface 11 as currently practiced, a region of surface 11 around the periphery thereof is used to provide purchase for a mask which assists in holding substrate 10 in place during fomation of layer 12. Thus layer 12 does not extend into this peripheral region. For substrates 10 actually processed in accordance with the present invention layer 12 covered about 85% of surface 11 for the larger substrates and about 90% of surface 11 for the smaller ones. A lower limit for coverage of surface 11 by layer 12 is believed to be about 50% but may even be about 30% or less. The appropriate coverage for a specific application is determined by one of ordinary skill in the art without undue experimentation.

Because PAMBE and MBE are both vapor phase processes, the quality of layer 12 can be made extremely pure HgTe or HgCdTe or whatever other compound or elemental combination is selected for the material of layer 12. The crystalline structure of the material for layer 12 does not appear to be critical, and thus at least some flaws in such structure may be tolerated while practicing the present invention.

More detail regarding MBE and PAMBE epitaxial growth may be had by reference to a pair of articles entitled "Growth of HgCdTe and other Hg-based films and multilayers by molecular beam epitaxy"—Harris, et al, *J. Vacuum Science and Technology*, Volume 4, No. 4, July/August 1986, pgs. 2061–2066 and "Properties of HgCdTe films and Hg-based quantum well structures grown by photoassisted molecular-beam epitaxy"—Myers et al, *J. Vacuum Science and Technology*, A7(2), March/April 1989, pgs. 300–304 which are both incorporated in their entirety herein by reference thereto.

Typically, substrate 10 will be maintained in the temperature range of about 150° C. to about 225° C., with a temperature of about 180° C. being common during PAMBE crystal growth of layer 12. Other parameters for growth of layer 12 such as concentrations of the vapor phase of its constituent parts or elements, vapor pressure of each constituent part or element of layer 12, overall pressure, and time of exposure to the constituent parts and growth of layer 12, are readily determinable by one or ordinary skill in the art without undue experimentation, and will, of course be dependent on temperature of substrate 10, the ultimate thickness of layer 12 desired and rate of growth of layer 12 which is typically about 0.5 to about 5 μm/hr for specified conditions.

Even though a PAMBE or MBE process for establishing layer 12 is preferred because the vapor phase from which crystal growth occurs is not contaminated by impurities, such as copper, which may be present in the starting materials used as the source for the vapors, a liquid phase epitaxy (LPE) process for growing layer 12 may also be employed. An LPE process typically uses melts of the starting or elemental materials, for example mercury, cadmium and/or tellurium, for layer 12, which are commonly obtained from the same sources as those used to obtain the building components that are combined to form the initial material for substrate 10. Because elemental materials, like cadmium and tellurium, are generally obtained from the same source as is the material of substrate 10, it may be expected that the same types of impurities will be present in the liquid melts prepared for an LPE process as are in the original starting material for substrate 10.

An LPE process may be used to grow a single crystal epitaxial layer 12 on surface 11 of substrate 10, as is known to those of ordinary skill in the art, in a manner analogous to PAMBE or MBE crystal formation. It is expected that an LPE grown layer 12 will have a similar but not as great effect on causing migration or segregation of impurities from substrate 10 into layer 12 as will a similarly sized (in area) and thickness layer 12 that is grown by PAMBE or MBE on surface 11.

Figure 3:
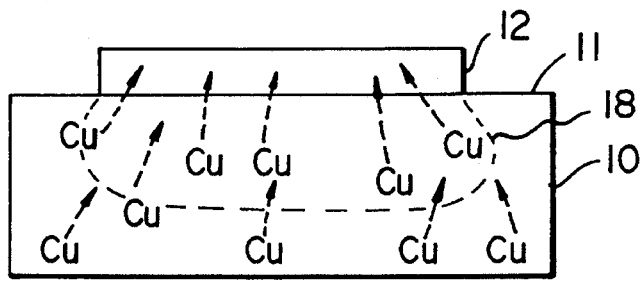

Referring to FIG. 3, substrate 10 having layer 12 disposed on its surface 11 is shown during an annealing step.

After layer 12 has been formed, such as by depositing or growing to the desired thickness and area on surface 11 of material 10, the combination of substrate 10 and layer 12 is placed in an evacuated ampule which is then sealed. The sealed ampule is placed in a preheated oven or furnace for annealing the combination, with substitute 10 held at a temperature of about 300° C. to about 450° C. in a mercury atmosphere under a mercury pressure within the ampule of about 15 to about 2000 torr, and preferably of about 1600 torr, for preventing evaporation or distillation of mercury from layer 12 during application of elevated temperatures while annealing. Typically, a quantity of mercury to be used as a source of mercury during annealing may also be disposed in the ampule before sealing and remote from the combination so that the temperature of the mercury source may be independently controlled for providing the desired overpressure of mercury. The temperature in the preheated oven during annealing is independently maintained in the area of the combination and source of mercury to provide a temperature profile for obtaining the foregoing conditions of this paragraph, i.e., temperature of the combination of substrate 10 and layer 12, and mercury overpressure, for a period of time that is adequate to cause desired migration or segregation of impurities from substrate 10 into layer 12.

The migration of impurities represented in FIG. 3 by the designation Cu as a result of annealing in accordance with the present invention is shown by a broken line having an arrow at one end to indicate the general direction of the segregation. It is noted that during the annealing process at least some impurities segregate across the boundary or interface between substrate 10 and layer 12 ultimately to reside in layer 12. Segregation of impurities causes a reduction or depletion of impurities in substrate 10.

For highly mobile impurity ions like copper, silver, gold, potassium and sodium it is believed that any such ions remaining in substrate 10 will be uniformly dispersed throughout substrate 10. For slower mobile impurity ions a region, or zone of ion depletion, 18 and 24 (FIG. 5) may be created. However, even for such slower moving ions, it is believed that regions 18 and 24 having a lower concentration of impurities, if they are indeed created at all, are only transient or fleeting and are very rapidly eliminated by the movement of ions within substrate 10, so that, in effect, after annealing substrate 10 will present a uniform, albeit lower concentration of impurities, then was the concentration in substrate 10 before annealing due to segregation of impurities into layer 12. Thus, regions 18 and 24 may only exist as a conceptual aid to understanding the mechanism of impurity ion movement and not as a representation of any actual specific arrangement of the impurity ions.

After removing the ampule containing the combination of substrate 10 and layer 12 from the oven, it is covered and permitted to cool to ambient which typically occurs in about 30 to 35 minutes. The cooled ampule is then opened and the combination of substrate 10 and layer 12 is then ready for further processing in accordance with the present invention.

Figure 4:
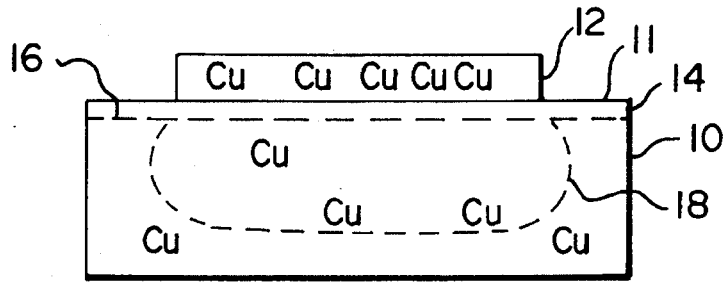

Referring to FIG. 4, sacrificial layer 12 along with impurities having migrated thereinto during previous processing and annealing as described above, along with an upper portion 14 of substrate 10 underlying layer 12, may be removed or separated from substrate 10 so as to leave exposed surface 16, as represented by a broken line, of substrate 10.

Removal of layer 12 and portion 14 may be effected by cutting or slicing substrate 10 along surface 16. Alternatively, and presently preferred, layer 12 and portion 14 may be removed by grinding or polishing. The polishing employed to remove layer 12 and portion 14 may be characterized as gross or coarse with respect to that used to prepare surface 11 for growth of layer 12. For removal of sacrificial layer 12 and portion 14 from substrate 10 by polishing, a 9 micron grit alumina slurry in conjunction with a Logitech brand polisher was used.

Once layer 12 has been removed and as presently preferred a portion 14 has also been removed to the desired depth, which is about 100 microns, then residual surface 16 may be prepared, such as by fine polishing as explained above with respect to surface 11, for receiving another grown layer 22 (FIG. 5), with the growth, anneal and removal operations being generally repeated until the desired amount or quantity of impurities are removed from substrate 10, or until the remaining material of substrate 10 has an impurity concentration below a predetermined level.

Figure 5:
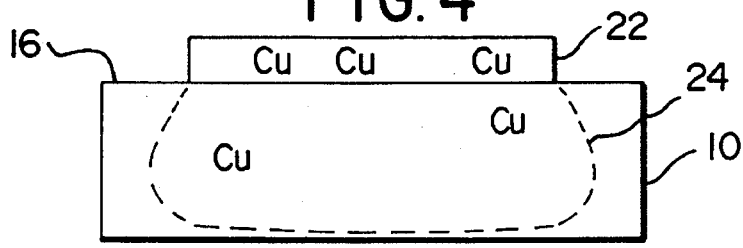

Referring to FIG. 5, substrate 10 resulting from removal of layer 12 and portion 14 includes growth of another layer 22 on surface 16 of substrate 10. Layer 22 may be formed analogously to layer 12. After subjecting the combination of substrate 10 and layer 22 to annealing in accordance with the present invention, it is expected that further impurities Cu would have migrated from substrate 10 into layer 22 as shown. Further processing may be performed on the material shown in FIG. 5 in accordance with the present invention and as described in conjunction with the description of FIGS. 1–4 until the desired size and/or purity of volume 24 is obtained. Once the desired purified substrate 10 is obtained, residual surface 16 may be prepared for receiving layer deposition and/or growths that will ultimately form electronic circuitry as is known in the art.

For the examples of HgTe on CdTe, HgTe on CdZnTe, HgCdTe on CdTe and HgCdTe on CdZnTe described above, attempts to measure the impurity level of copper in substrate 10 were unable to detect any residual copper after the growth, anneal and removal of a single layer 12 and portion 14 of substrate 10. Although such results were encouraging, it is not known with certainty whether all copper was indeed removed from substrate 10 by processing in accordance with the present invention, or whether any residual copper in substrate 10 was below the minimum concentration level for detection by the measurement technique being used. Such measurements were conducted using a secondary ion mass spectometry (SIMS) process having a minimum detection threshold of about $10^{15}$ ions per cubic centimeter. Accordingly, it may be assumed that processing in accordance with the present invention with one application and removal of layer 12 and a portion of substrate 10 as described above reduced the concentration of copper to at least slightly below $10^{15}$ ions, or charged atoms, per cubic centimeter in the remaining substrate 10. This is so even though the absolute concentration of residual copper in substrate 10 may have been substantially or even orders of magnitude reduced from this minimal detectable level. Further, tests performed on substrates processed in accordance with the present invention and having electronic circuitry subsequently formed thereon, indicate that electrical performance of such circuitry does not appear to be adversely influenced by impurities, including copper.

Besides migration of copper from substrate 10 into layer 12 during annealing as described above, from where it is readily physically separated from substrate 10 in accordance with the present invention, it is believed that other impurities may also be removed from substrate 10 by use of the present invention and/or during or concurrently with copper removal from substrate 10 in accordance with the present invention. In order to be subject to such removal, the impurities should be highly mobile metallic elements, like copper, silver, gold, potassium and sodium, that segregate or migrate during annealing because they prefer to be situated in the material of layer 12, such as HgCdTe or HgTe, rather than in that of substrate 10. Further, in all cases, the impurities which are desired to be removed from substrate 10 in accordance with the present invention should not be so tightly bound in the lattice structure of substrate 10 or to constituents of substrate 10 that they will not migrate to layer 12 at least upon application of heat during anneal.

The following examples are illustrative of aspects of the present invention:

EXAMPLE 1

A surface having dimensions of about 1 cm×1 cm of a substrate comprising cadmium telluride was prepared to receive an epitaxially grown layer by polish a brief standard chemi-mechanical using bromine method and solution. The substrate was then placed in an annealing furnace or oven and brought to a temperature of 180° C. Light from an argon ion laser was shone on the prepared surface at an intensity of about 100 mw/cm². A layer of $Hg_{1-x}Cd_xTe$ with x=0.2 was grown on about 90% of the prepared surface at the rate of 2 μm/hour for a period of five hours. That is, until the layer achieved a thickness of 10 μm. The combination of substrate and grown layer was removed from the furnace and cooled to ambient. A source of mercury was placed at a blind end of an elongated evacuated ampule, the combination was placed in about the middle of the ampule and the ampule was sealed. The sealed ampule was placed in a preheated oven where the combination was maintained at 400° C. and the temperature of the mercury source was adjusted to provide an overpressure of mercury vapor within the ampule of 1600 torr. The target conditions within the ampule were maintained for 5 hours for annealing, after which time the ampule was removed from the oven, covered and permitted to cool to ambient as described above. Removal of the grown layer and a portion of the substrate to a depth of about 100 μm was performed by polishing with 9 micron grit alumina slurry. SIMS measurements on the remaining substrate did not detect any concentration of copper therein.

EXAMPLE 2

Processing substantially the same as that described for Example 1 was repeated for a substrate comprising cadmium zinc telluride with the same measurement results obtained.

Substrates having prepared surfaces of about 1.5 cm by about 1.5 cm and about 2 cm by 2 cm were also used in processing according to Examples 1 and 2 above, with the same measurements obtained.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A method for purifying a first material suitable for forming a substrate to receive a subsequent layer of semiconductor material for forming of electronic circuitry, the first material including at least an impurity and a first surface, the method comprising:

forming a first layer of a second material on at least a portion of the first surface of the first material;

heating the combination of the first and second material to a temperature adequate to cause migration of at least some of the impurity from the first material into the second material; and removing the second material along with the migrated impurity to expose a second surface of the first material, the second surface for receiving the subsequent layer, wherein the first material includes an item selected from the group consisting of cadmium telluride, cadmium zinc telluride and cadmium telluride selenide, and the second material includes an item selected from the group consisting of mercury telluride and mercury cadmium telluride.

2. The method as in claim 1, wherein the steps of forming, heating and removing are each repeated a sufficient number of times until a predetermined purity of the first material as determined in response to the level of the impurity remaining in the first material is obtained.

3. The method as in claim 1, wherein the step of removing includes removing a part of the first material.

4. The method as in claim 1 wherein the step of heating is performed while the combination is in an environment having an overpressure of mercury for preventing mercury from leaving the first layer during heating of the combination.

5. The method as in claim 1, wherein the step of removing includes polishing the second material to effect its removal.

6. The method as in claim 1, wherein the step of removing includes cutting between the first layer and the first material to effect removal of the first layer.

7. The method as in claim 1, wherein the step of forming includes forming the first layer by a semiconductor material growth process selected from the group consisting of photon assisted molecular beam epitaxy, molecular beam epitaxy, liquid phase epitaxy, metal organic chemical vapor deposition and isothermal vapor phase epitaxy.

8. The method as in claim 1 wherein the cadmium and tellurium constituents of the first material are obtained as a by-product of copper mining.

9. The method as in claim 1, wherein the at least an impurity includes copper.

10. The method as in claim 1, wherein the at least an impurity includes an item selected from the group consisting of copper, silver, gold, potassium, sodium and combinations thereof.

* * * * *